US008756467B2

(12) United States Patent
Vaccaro et al.

(10) Patent No.: US 8,756,467 B2
(45) Date of Patent: Jun. 17, 2014

(54) METHODS AND APPARATUS FOR TESTING MULTIPLE-IC DEVICES

(75) Inventors: Joseph S. Vaccaro, Chandler, AZ (US); Michael E. Stanley, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 102 days.

(21) Appl. No.: 13/308,236

(22) Filed: Nov. 30, 2011

(65) Prior Publication Data

US 2013/0139015 A1 May 30, 2013

(51) Int. Cl.
*G01R 31/28* (2006.01)
*G01R 31/3185* (2006.01)

(52) U.S. Cl.
CPC *G01R 31/318572* (2013.01); *G01R 31/318513* (2013.01)
USPC .......................................... 714/727; 714/729

(58) Field of Classification Search
CPC ................ G01R 31/318572; G01R 31/318513
See application file for complete search history.

(56) References Cited

U.S. PATENT DOCUMENTS

| 5,841,791 | A * | 11/1998 | Hashizume .................. 714/726 |
| 6,324,662 | B1 | 11/2001 | Haroun et al. |
| 6,728,814 | B2 * | 4/2004 | Leinen .......................... 710/305 |
| 6,975,980 | B2 * | 12/2005 | Whetsel ......................... 703/25 |
| 7,299,343 | B2 * | 11/2007 | Kalluri et al. ................. 712/226 |
| 7,346,821 | B2 * | 3/2008 | Whetsel ........................ 714/727 |
| 7,590,910 | B2 | 9/2009 | Haroun et al. |
| 7,743,278 | B2 * | 6/2010 | Ikeda et al. ..................... 714/27 |
| 7,930,606 | B2 * | 4/2011 | Machimura et al. .......... 714/727 |
| 8,006,151 | B2 * | 8/2011 | Whetsel ........................ 714/727 |
| 8,195,923 | B2 * | 6/2012 | Spracklen et al. ............ 712/209 |
| 2003/0009715 | A1 * | 1/2003 | Ricchetti et al. .............. 714/727 |
| 2009/0019328 | A1 | 1/2009 | Van De Logt |
| 2009/0309609 | A1 | 12/2009 | De Jong et al. |

OTHER PUBLICATIONS

IEEE-SA Standards Board, "IEEE Standard Test Access Port and Boundary-Scan Architecture," Test Technology Standards Committee of the IEEE Computer Society, Mar. 27, 2008.

* cited by examiner

*Primary Examiner* — Steve Nguyen
(74) *Attorney, Agent, or Firm* — Sherry W. Schumm (57) ABSTRACT

Embodiments of integrated circuits include a first input interconnect, a second input interconnect, an output interconnect, a shift register, a select register, a test access port (TAP) controller, and select register decode circuitry. The TAP controller is coupled to the first input interconnect and the select register, and the TAP controller is configured to shift a select value provided on the first input interconnect into the select register. The select register decode circuitry is configured to control, based on the select value, which of a plurality of test data output signals are provided to the output interconnect, where the plurality of test data output signals includes a first test data output signal and a second test data output signal. The first test data output signal is provided by the shift register, and the second test data output signal is received from a second integrated circuit on the second input interconnect.

19 Claims, 6 Drawing Sheets

METHODS AND APPARATUS FOR TESTING MULTIPLE-IC DEVICES

TECHNICAL FIELD

Embodiments relate to testing methods and apparatus for integrated circuits.

BACKGROUND

To facilitate debug operations, many current integrated circuits (ICs) include Joint Test Action Group (JTAG) compliant circuitry (standardized as IEEE 1149.1 Standard Test Access Port and Boundary-Scan Architecture). JTAG-compliant circuitry and methods of using the circuitry in testing an IC (collectively referred to simply as "JTAG") provides access to internal blocks of an IC, making JTAG particularly well suited for debugging embedded systems. More particularly, in a device that supports JTAG-compliant boundary scan technology, signals between the device's core logic and the device's pins are intercepted by boundary scan cells, which are coupled together to form a serial scan path known as the boundary scan register (BSR). Normally, the boundary scan cells do not affect IC operations. In test mode, however, the boundary scan cells may be used to set and/or read values. For example, JTAG may be used to manipulate the external interface to an IC's BSR in order to test for certain types of faults (e.g., shorts, opens, and logic faults).

When implemented on an IC, JTAG-compliant circuitry includes, at least, a JTAG interface and a controller with access to an instruction register and a plurality of data registers. The JTAG interface (collectively known as a test access port, or TAP) is either a four-interconnect or a five-interconnect interface. The four primary interconnects include: TMS (test mode state); TCK (clock); TDI (test data in); and TDO (test data out). The JTAG interface may include an extra interconnect when a TRST (test reset) interconnect is implemented. A test reset signal provided via a TRST interconnect may cause a corresponding test reset circuit to generate a system level reset, in an embodiment.

To communicate with a JTAG interface, a host computer may be connected to a target IC's JTAG interface (e.g., through a JTAG adaptor), and the host computer may cause signals to be provided to or read from the JTAG interface. More particularly, the host computer communicates with an IC's TAP controller by manipulating signals on TMS and TDI in conjunction with clocking signals on TCK, and by reading signals presented by the IC on TDO. The state of the TAP controller may change on TCK transitions.

In some multiple-IC systems, such as a system-in-package (SiP), there may be an insufficient number of available package pins to support dedicated, external JTAG interface pins for each IC of the system. Some of these systems may include a single set of external JTAG interface pins that connect, either directly or indirectly, with the JTAG interfaces of the various ICs. In order to test one of the ICs, all ICs except for the IC under tested are set into a "TDI-to-TDO bypass" mode (i.e., a mode in which the IC's TDI and TDO interconnects are essentially directly connected through a TDI-to-TDO bypass register of the IC). In such a configuration, the TDI signals presented at the external TDI pin are passed to the IC under test, and the TDO signals produced by the IC under test appear at the external TDO pin.

Figure 1:
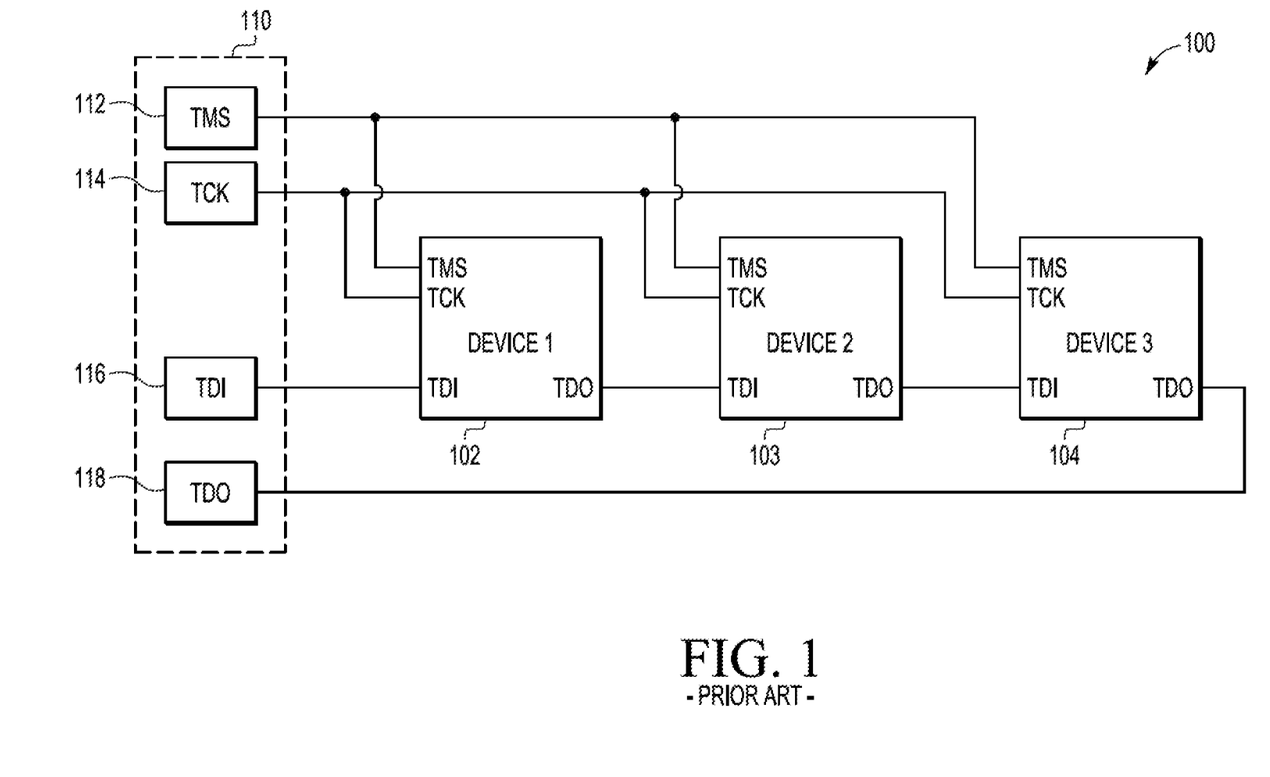
FIG. 1 illustrates a simplified circuit diagram of a plurality of interconnected ICs with JTAG testing capability, in accordance with the prior art.

For example, FIG. 1 illustrates a simplified circuit diagram 100 of a plurality of ICs 102, 103, 104 with their JTAG TDO and TDI interconnects daisy-chained together, in accordance with the prior art. In the illustrated configuration, access to all of the ICs 102-104 may be provided through a single, external JTAG interface 110. The TMS pin 112 and TCK pin 114 are directly connected to the TMS and TCK interconnects of each IC 102-104, and the TDI and TDO interconnects are daisy-chained together. In other words, the TDI interconnect of a first IC 102 is directly connected to the external TDI pin 116, the TDO interconnect of the first IC 102 is connected to the TDI interconnect of the second IC 103, the TDO interconnect of the second IC 103 is connected to the TDI interconnect of the third IC 104, and the TDO interconnect of the third IC 104 is directly connected to the external TDO pin 118.

To test any one of the ICs (e.g., IC 104), the other ICs (e.g., ICs 102, 103) are set into TDI-to-TDO bypass mode (e.g., by clocking in a BYPASS instruction). The clock input is provided at the TCK pin 114, and clocking changes on the TMS pin 112 step through a standardized JTAG state machine implemented in each of the ICs TAP controllers (not illustrated). In the Shift_IR and Shift_DR states, one bit of data may be transferred from the TDI pin 116 into and out of each tap controller instruction or data register (also not illustrated), respectively, in conjunction with each TCK clock pulse. For example, typical instructions might include: reading or writing data to a data register (e.g., the BSR, TDI-to-TDO bypass register, or the IDCODE register); sampling input pins; driving (or floating) output pins; and so on. Although all of the ICs 102-104 operate in lockstep, only the IC under test (i.e., the IC that is not in TDI-to-TDO bypass mode) is affected by the input signal on the external TDI pin 116 in order to produce valid test data on its TDO port. That valid test data, in turn, is produced at the external TDO pin 118.

DETAILED DESCRIPTION

Although prior, multiple IC SiPs that are JTAG compliant (e.g., circuit 100, FIG. 1) provide some limited ability to test each of the multiple ICs in the SiP, testing configurations are desired that may reduce required numbers of package pins and inter-IC routing within a package. Embodiments include systems (e.g., a SiP) in which complementary test circuitry on multiple ICs (e.g., multiple controllers) allow internal ICs with no direct JTAG connection to external circuitry (e.g., no external JTAG pins) to be fully testable. Embodiments of the inventive subject matter may be used with any of a variety of multiple-IC systems, including SiPs, systems on a chip (SoCs), and systems that include separately packaged ICs interconnected through a circuit board. Although a specific example of a SiP is described herein, it is to be understood that the example is not meant to be limiting, and that the example is provided to enhance understanding of the various embodiments.

As used herein, the terms "pin" and "package pin" mean a conductive connection between circuitry external to a package and circuitry internal to the package. A "pin" or "package pin" should be interpreted to include a pin, a pad, a bump, a ball, and any other conductive connection. The term "interconnect" means an input (I) conductor for a particular IC, an output (O) conductor for a particular IC, or a conductor serving a dual I/O purpose for a particular IC. In some cases, an interconnect may be directly coupled with a package pin, and in other cases, an interconnect may be coupled with an interconnect of another IC, as is described in more detail herein.

Figure 2:
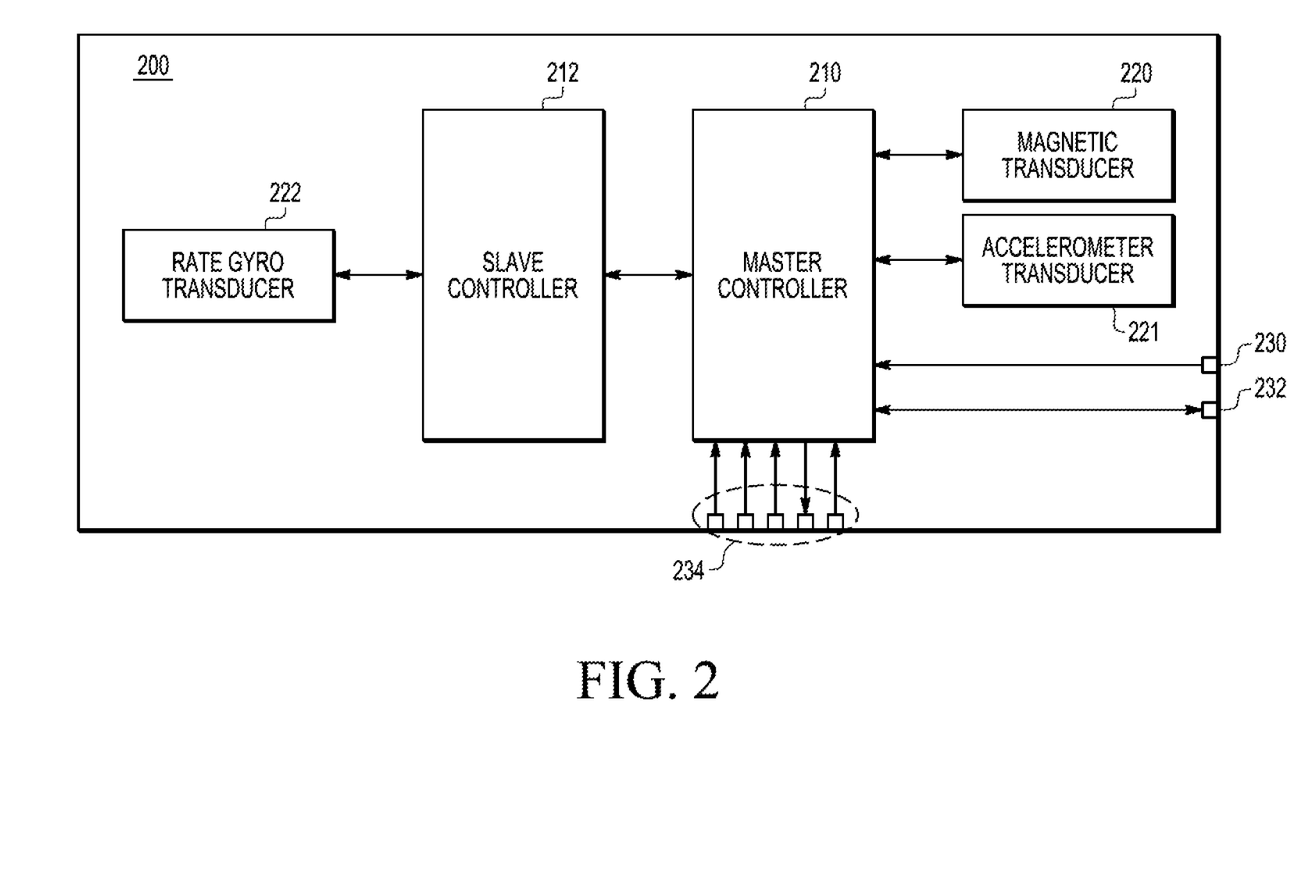
FIG. 2 illustrates a simplified block diagram of an example system in which an embodiment of the inventive subject matter may be implemented.

FIG. 2 illustrates a simplified block diagram of an example system 200 in which an embodiment of the inventive subject matter may be implemented. More particularly, system 200 is a multiple integrated circuit package (e.g., a SiP) that may be incorporated into a device to sense the motion (e.g., displacement and rotation) of the device in three-dimensional space (providing measurement of six degrees of freedom), and also to track the location of the device on the Earth.

System 200 includes multiple controller ICs 210, 212 (referred to herein as "controllers") and multiple transducers 220, 221, 222. More particularly, a master controller 210 is used to interface with a magnetic transducer 220 and an accelerometer transducer 221, and a slave controller 212 is used to interface with a rate gyro transducer 222. The magnetic transducer 220 is configured to produce signals indicating the strength of the Earth's magnetic field, which information may be used for navigation-related and location-related applications. The accelerometer transducer 221 and the rate gyro transducer 222 produce signals (e.g., indicating acceleration and rate of change of angle), which enable the linear motion and orientation of the device to be determined. This information may be useful for a variety of purposes, including determining which orientation (e.g., portrait or landscape) to use to display information on a display device, among other things.

Both the master controller 210 and the slave controller 212 may be configured in a functional mode, a JTAG test mode, or another type of test mode. As indicated above, when configured in a functional mode, the master controller 210 is used to interface with a magnetic transducer 220 and an accelerometer transducer 221, and the slave controller 212 is used to interface with a rate gyro transducer 222. When configured in the JTAG test mode, the master controller 210 and the slave controller 212 are designed to support JTAG-compliant testing.

As shown, the master controller 210, which is upstream of the slave controller 212, is directly connected to various ones of the system's I/O pins. Conversely, the slave controller 212 is not directly connected to system I/O pins. In the illustrated embodiment, the master controller 210 is shown to be connected with pins 230, 232, and 234. Although a single pin is shown for each of pins 230, 232, multiple pins 230 and/or multiple pins 232 having the respective functionalities described below actually may be included in the system 200, in various embodiments. Each pin 230 represents an analog input to master controller 210, which may originate from a remote analog sensor, for example. Pin 232 represents a serial port, which may be connected to one or more other external devices (e.g., other sensors, not illustrated). The serial port may correspond to a master/slave serial port, for example, to support master controller 210 mastering other external devices. In an embodiment in which the serial port is an I2C (inter-integrated circuit) port, for example, pin 232 actually may include two or more pins. Alternatively, in an embodiment in which the serial port is a SPI (serial peripheral interface), pin 232 actually may include four or more pins. Some devices may have an option to implement a SPI or an I2C port (e.g., the port may be a dual-mode I2C/SPI port). Other serial or parallel port protocols also may be implemented, in other embodiments.

In an embodiment, the master controller 210 also is connected with a plurality of pins 234 that may be used in a JTAG test mode. More particularly, pins 234 correspond to an external JTAG port. For a five-interconnect JTAG port, as illustrated, pins 234 correspond to TDI (test data in), TMS (test mode state), TCK (clock), TDO (test data out), and TRST (test reset) pins. For a four-interconnect JTAG port, the TRST pin may be excluded.

Once in the JTAG test mode, either the master controller 210 or the slave controller 212 may be configured in a "TDI-to-TDO bypass mode" by clocking a BYPASS instruction into TAP controller instruction registers (e.g., instruction register 350, FIG. 3) of the master or slave controller 210, 212. In the TDI-to-TDO bypass mode, data clocked in on the TDI interconnect passes through a TDI-to-TDO bypass register (e.g., bypass register 363, FIG. 3) to the TDO interconnect (e.g., TDO interconnect 324, FIG. 3). In order to perform JTAG testing on the master controller 210, the slave controller 212 may be configured in the TDI-to-TDO bypass mode, at various times, although configuration in the TDI-to-TDO bypass mode is not required for all JTAG testing. Similarly, to perform JTAG testing on the slave controller 212, the master controller 210 may be configured in the TDI-to-TDO bypass mode, at various times. When the master controller 210 is in the TDI-to-TDO bypass mode, the master controller 210 passes signals present on the external TDI, TMS, TCK, and TRST pins (e.g., the four pins 234 indicated with arrows to be inputs) through to corresponding JTAG interconnects of the slave controller 212, and passes signals present on the slave controller's TDO interconnect through to the external TDO pin (the one of pins 234 indicated with an arrow to be an output).

Although not shown, system 200 also may include additional peripherals, memory, and so on. In addition, it is to be understood that system 200 represents just one example of a system in which embodiments of the inventive subject matter may be incorporated. In other embodiments, a system may include more than two controllers, ICs other than controllers, and/or each of the controllers or ICs may interface with different types of transducers, ports or other circuitry. A more general description of an IC with JTAG testing capabilities according to an embodiment will now be given.

Figure 3:
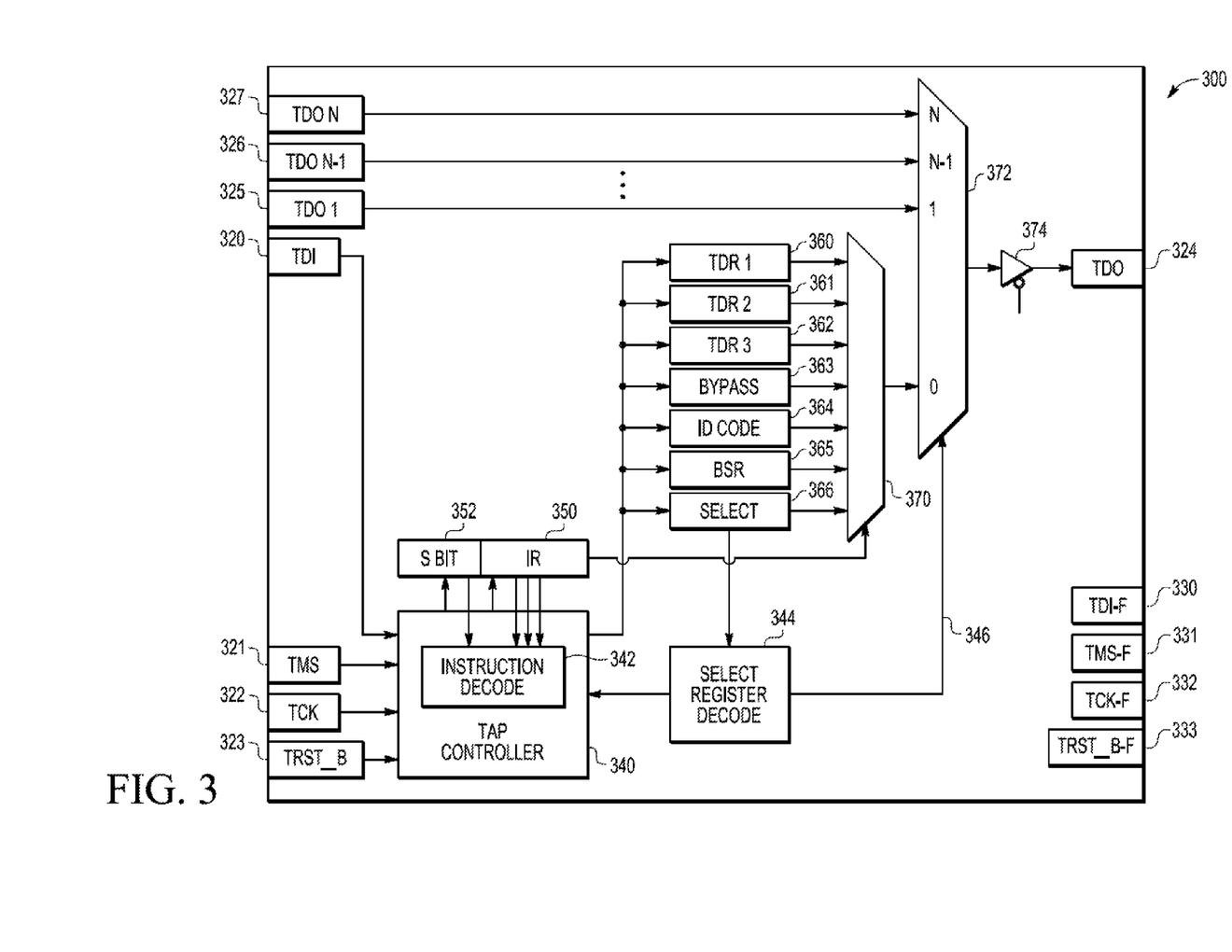
FIG. 3 illustrates a simplified block diagram of an IC with integrated test circuitry, according to an example embodiment.

More specifically, FIG. 3 illustrates a simplified block diagram of an IC (e.g., a controller or other IC) that includes an integrated test circuit 300, according to an example embodiment. In addition to the test circuit 300, the IC also may include a master port (e.g., a SPI or I2C port, not illustrated), a slave port (e.g., a SPI or I2C port, not illustrated), a central processing unit (CPU, not illustrated), reset circuitry (not illustrated), and/or other circuitry appropriate for the intended functionality of the IC. In other embodiments, test circuitry such as that described herein may be used to test FPGAs (field programmable gate arrays), ASICs (application-specific integrated circuits), and other types of ICs. Although not illustrated, the IC also may include a plurality of signal (I/O) interconnects that interface with master port, slave port, and CPU, one or more power interconnects, and one or more ground interconnects. In addition, the IC may include other hardware having states that may be affected by operations performed using the test circuit 300, and one or more scan chains (not illustrated) that may be used to feed test patterns into CPU or the other hardware. Further, test circuit 300 also includes circuitry (not shown) that supports coordinated reset of the IC and any downstream ICs based on signals present on a reset input (e.g., signals present on the TRST_B interconnect 323). The system may, for example, support an active-low reset, as indicated, although those of skill in the art would understand that the system alternatively may support an active-high reset.

Test circuit 300 is accessed through a JTAG port, which includes a plurality of JTAG interconnects. The JTAG interconnects include a TDI interconnect 320; a TMS interconnect 321; a TCK interconnect 322; a TRST_B interconnect 323; and a TDO interconnect 324. According to an embodiment, signals from TDI, TMS, TCK, and TRST_B interconnects 320-323 are passed through to TDI-F, TMS-F, TCK-F, and TRST_B-F interconnects 330-333 via conductors and other components (not shown) of test circuit 300. As will be described in more detail in conjunction with FIGS. 4 and 5, the TDI-F, TMS-F, TCK-F, and TRST_B interconnects 330-333 may be coupled to corresponding TDI, TMS, TCK, and TRST_B interconnects of a downstream IC. This enables signals present on the TDI-F, TMS-F, TCK-F, and TRST_B-F interconnects 330-333 to be passed to downstream ICs, in an embodiment. Accordingly, the JTAG test circuitry of multiple, interconnected ICs may be operated synchronously. The test clock is provided by an external clock source (e.g., a clock generated by external test equipment) via a TCK interconnect 322. However, the signals being transferred between the TDI/TMS/TCK/TRST_B interfaces 320-323 and the TDI-F/TMS-F/TCK-F/TRST_F interfaces 330-333 are transferred in an unclocked manner, in an embodiment. The TDO interconnect 324 may be coupled to an external TDO pin of the system (e.g., TDO pin 424 or 524, FIGS. 4 and 5) or to an "input" TDO interconnect (e.g., one of TDO interconnects 325, 326, 327), in various embodiments. According to an embodiment, test circuitry 300 includes N input TDO interconnects, where N is an integer that is as large as the number of downstream ICs in the system. In a system in which only a single downstream IC is included, N may be as small as one. In the embodiments discussed in conjunction with FIGS. 4 and 5, N is equal to three, meaning that three downstream ICs are coupled in parallel (FIG. 4) or in series (FIG. 5) with the IC that includes test circuit 300. It is to be understood that more or fewer than three downstream ICs may be included in the system, and accordingly, N may be a value other than three.

Along with the various interconnects 320-327, 330-333, test circuit 300 also includes an instruction register (IR) 350, a plurality of shift registers 360-366, a TAP controller 340, instruction decode circuitry 342, select register decode circuitry 344, multiplexers 370, 372, and various other logic, the functionality of which will be described in detail below. For example, tap controller 340 implements a JTAG state machine (e.g., as defined in IEEE Standard 1149.1), in which state transitions occur based on clocking changes on the TMS interconnect 321. For example, the JTAG state machine will have one state associated with shifting instructions into the IR 350 (e.g., in a Shift_IR state), and another state associated with shifting data into and/or through the data shift registers 360-366 (e.g., in a Shift_DR state). Once an instruction is shifted into IR 350, instruction decode circuitry 342 associated with the TAP controller 340 may cause the TAP controller 340 to execute that instruction. Instruction decode circuitry 342 decodes opcodes shifted into the IR 350 according to a pre-defined mapping of opcodes to instructions, as will be described in more detail later. As will also be described in more detail later, the instruction decode circuitry 340 also factors in a value in S bit register 352 in the mapping of opcodes to instructions. TAP controller 340 also may interface with test subsystem (not illustrated), which provides additional controls for various test modes (e.g., RAM BIST (built-in self test), scans (e.g., battery scans, internal scans), specialized analog test modes, and so on).

The IR 350 receives signals from the TDI interconnect 320 via TAP controller 340. The IR 350 also is a shift register, similar to shift registers 360-366, although values are shifted into the IR 350 when the JTAG state machine is in the Shift_IR state, whereas values are shifted into the shift registers 360-366 when the JTAG state machine is in the Shift_DR state, as indicated above. IR 350 may hold a current instruction for decoding by instruction decode circuitry 342 and execution by TAP controller 340. Essentially, the content of IR 350 is used by the TAP controller 340 to determine how to process signals received via the TDI interconnect 320. In many cases, the IR 350 includes an enable instruction that defines to which of the shift registers 360-366 input signals from the TDI interconnect 320 should be passed while the JTAG state machine is in the Shift_DR state. The IR 350 may be, for example, between four to seven bits wide, although the IR 350 may be narrower or wider, in various embodiments.

The shift registers 360-366 may include, for example, a plurality of test data registers (TDR) 360, 361, 362, a bypass register 363, an ID code register 364, a boundary scan register (BSR) 365 (also referred to as a boundary scan chain or EXTEST register), and a select register 366, according to an embodiment. Although three TDRs 360-362 are shown, test circuit 300 may include more or fewer TDRs. The shift registers 360-366 are parallel connected between the TDI interconnect 320 (with TAP controller 340 intervening) and the TDO interconnect 324 (with multiplexers 370, 372 intervening) so that a selected shift register 360-366 will shift data one stage toward the TDO interconnect 324 after each rising edge of a clock signal on the TCK interconnect 322 when the TAP controller 340 is in the appropriate state (i.e., in the Shift_DR state). Each of the shift registers 360-366 may be enabled by clocking a corresponding register enable instruction into IR 350. Once enabled, a value may be clocked into the shift register 360-366 associated with the enable instruction. The lengths of the shift registers 360-366 can be different. Therefore, the number of clock cycles required to shift in a complete data value can differ.

When the IC is in the TDI-to-TDO bypass mode, the bypass register 363 (e.g., a single bit register) is used to pass data from the TDI interconnect 320 to the TDO interconnect 324. The ID code register 364 (e.g., a register of 32 bits) may be used to store an identification (ID) code for the IC. The identification code may have a format that includes a manufacturer code, a part number assigned by the manufacturer, and a part version code (or revision number), for example. The information in the ID code register 364 may allow the IC to be linked to a corresponding BSDL file. BSR 365, which may or may not be implemented, in various embodiments, is comprised of a plurality of boundary scan cells connected in a dedicated path around the periphery of the IC, and the BSR 365 is used to move data to and from the I/O pins of the IC. More particularly, a boundary scan cell may be connected between each signal interconnect (or pin) and internal logic. The contents of the BSR 365 may be described using a BSDL (boundary scan description language) file.

As indicated above, the select register 366 may be enabled (e.g., by clocking a select register enable instruction into IR 350 when the JTAG state machine is in the Shift_IR state) and, once enabled, a "TDO select value" may be clocked into the select register 366 (e.g., by clocking the TDO select value into the select register 366 when the JTAG state machine is in the Shift_DR state). Depending on the TDO select value clocked into the select register 366, the select register decode circuitry 344 controls TDO select MUX 372 to output one of a plurality of inputs to MUX 372. Ultimately, the TDO select value clocked into the select register 366 controls which IC provides a TDO signal to the TDO pin (e.g., TDO pin 424 or 524, FIGS. 4, 5) of the system.

The inputs to TDO select MUX 372 include local output test data from one of shift registers 360-366. More particularly, according to an embodiment, each of shift registers 360-366 may provide an input to MUX 370, and MUX 370 outputs one the shift register inputs to an input of TDO select MUX 372 (e.g., to input 0 of TDO select MUX 372, as illustrated in FIG. 3). MUX 370 selects which of the shift register inputs to provide to TDO select MUX 372 based on the current instruction in IR 350. For example, if the current instruction in IR 350 corresponds to an EXTEST instruction (described in more detail below), MUX 370 outputs values from BSR 365 to TDO select MUX 372.

Figure 4:
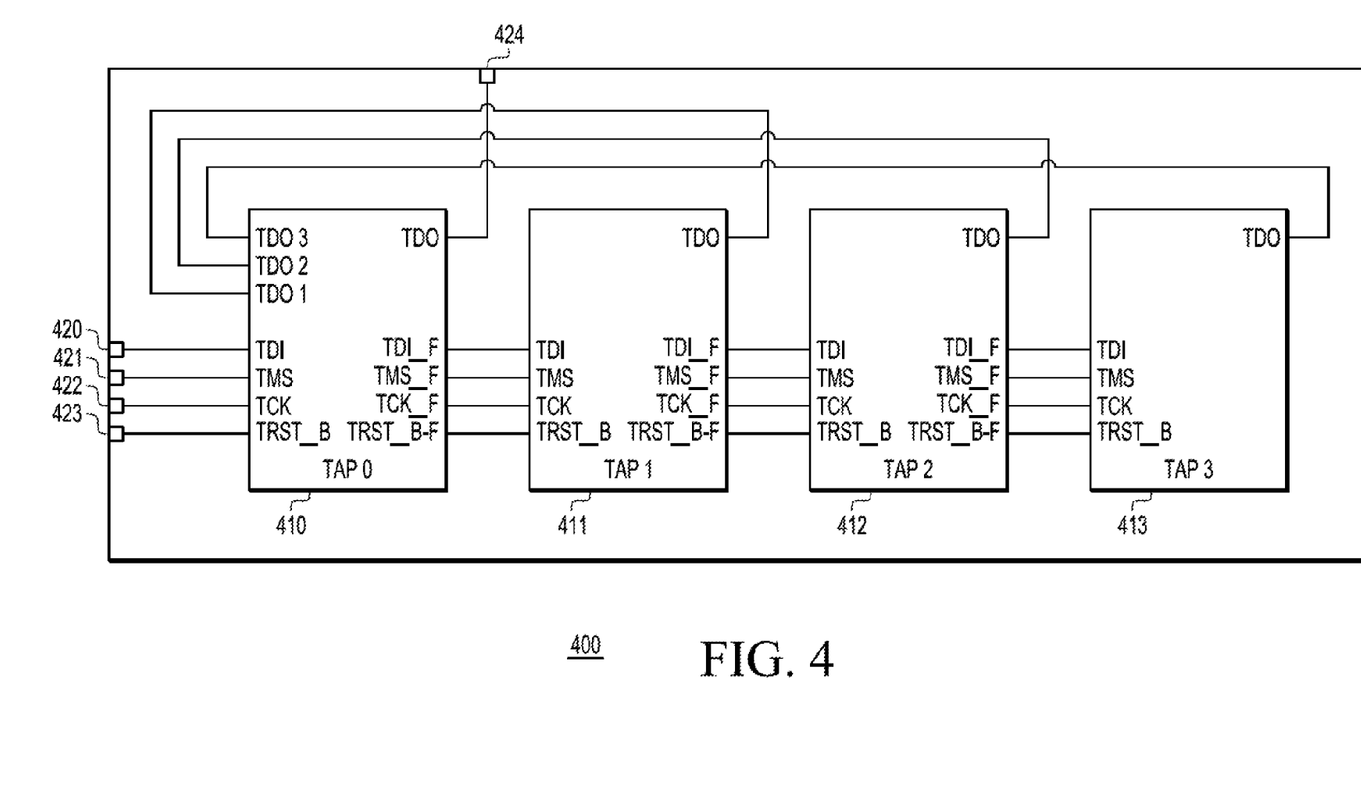
FIG. 4 illustrates a simplified block diagram of a system with parallel-coupled ICs, according to an example embodiment.
Figure 5:
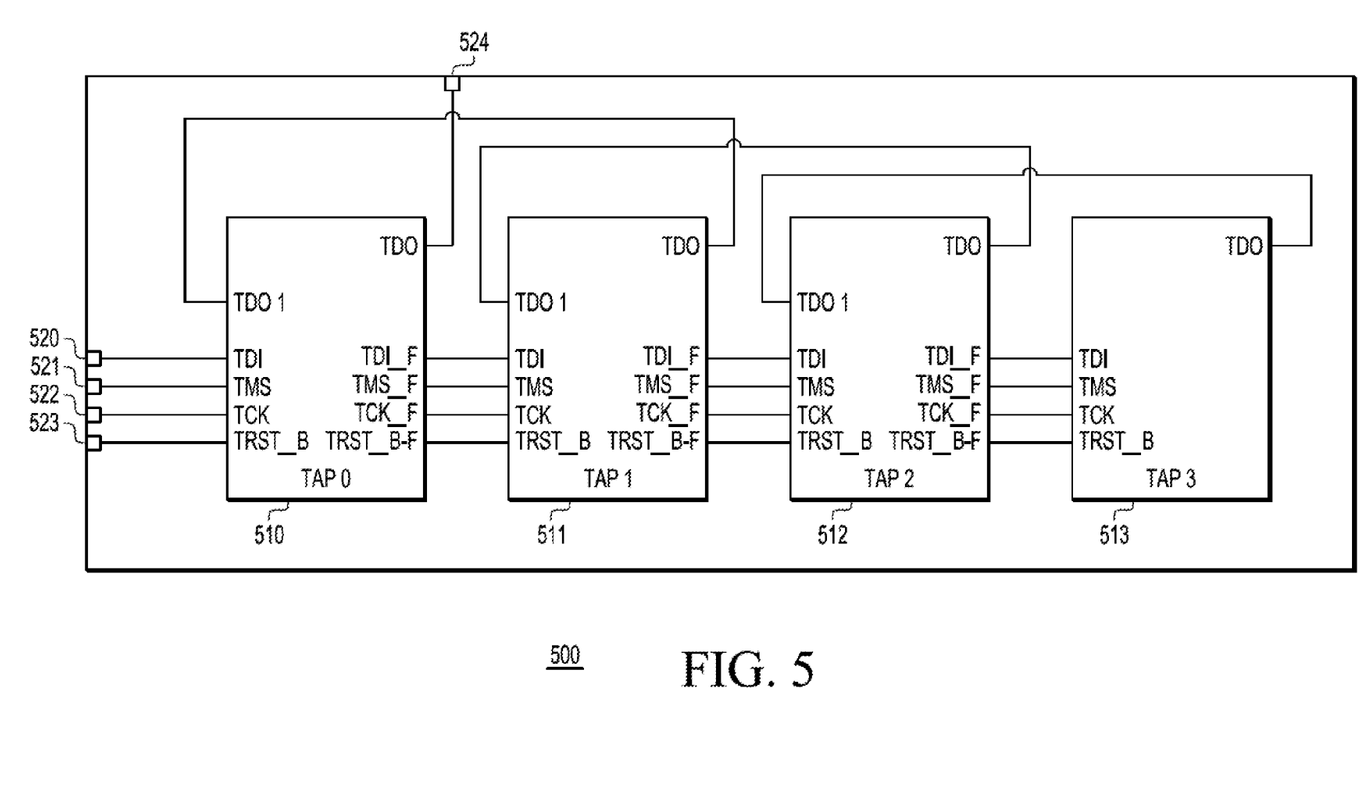
FIG. 5 illustrates a simplified block diagram of a system with serial-coupled ICs, according to another example embodiment.

The inputs to TDO select MUX 372 also include non-local output test data that is produced by one or more downstream ICs, which provide their output test data to test circuit 300 via downstream TDO interconnects 325-327. According to an embodiment, downstream TDO interconnects 325-327 are coupled to other inputs of TDO select MUX 372 (e.g., to inputs 1 ... N-1, N of TDO select MUX 372, as illustrated in FIG. 3). By including N downstream TDO interconnects 325-327, the TDO interconnects from N downstream ICs may be coupled to the TDO interconnects 325-327 (e.g., as shown in FIG. 4, where N equals three), in an embodiment. This type of configuration of ICs is referred to herein as "parallel-coupled" ICs, and such a configuration will be discussed in more detail in conjunction with FIG. 4, later. In an alternate embodiment, ICs may be "serial-coupled" (e.g., as shown in FIG. 5). In a serial-coupled configuration, the TDO interconnect of each downstream IC is coupled to a downstream TDO interconnect (e.g., TDO 1 325) of the next upstream IC. In such an embodiment, the test circuit 300 may include only one downstream TDO interconnect (e.g., TDO 1 325), and TDO select MUX 372 may include as few as two inputs (i.e., one input connected to receive an output from MUX 370 and another input connected to receive output test data from a downstream IC via a downstream TDO interconnect (e.g., TDO 1 325). In still another alternate embodiment, a system may include both parallel-coupled and serial-coupled ICs. Either way, TDO select MUX 372 outputs one of its inputs (via gate 374) to the TDO interconnect 324 based on a TDO select signal 346 from select register decode circuit 344. When test circuit 300 corresponds to a circuit in the most upstream IC (e.g., IC 410 or 510, FIGS. 4, 5), the signal on TDO interconnect 324 is provided to the TDO pin (e.g., TDO pin 424 or 524, FIGS. 4, 5) of the system.

As mentioned above, depending on the TDO select value clocked into the select register 366, the select register decode circuitry 344 controls TDO select MUX 372 to output one of the plurality of inputs to MUX 372. More particularly, a unique TDO select value may be assigned to each of N ICs of the system, and select register decode circuitry 344 may decode a current value within the select register 366 to determine which input to TDO select MUX 372 should be output from TDO select MUX 372. For example, assume a TDO select value of "0 0" is assigned to the IC associated with test circuit 300 (e.g., referred to as IC 0), a TDO select value of "0 1" is assigned to a second IC having its TDO interconnect coupled to downstream TDO interconnect 325 (e.g., referred to as IC 1), a TDO select value of "1 0" is assigned to a third IC having its TDO interconnect coupled to downstream TDO interconnect 326 (e.g., referred to as IC N-1), and a TDO select value of "1 1" is assigned to a fourth IC having its TDO interconnect coupled to downstream TDO interconnect 327 (e.g., referred to as IC N). According to the above example, when select register decode circuitry 344 receives a TDO select value of "0 0" from the select register 366, the TDO select signal 346 provided by select register decode circuitry 344 controls TDO select MUX 372 to output values from MUX 370 (i.e., values from one of shift registers 360-366) to TDO interconnect 324. Conversely, when select register decode circuitry 344 receives a TDO select value of "0 1" from the select register 366, the TDO select signal 346 provided by select register decode circuitry 344 controls TDO select MUX 372 to output values from downstream TDO interconnect 325 to TDO interconnect 324, and so on.

According to an embodiment, in addition to controlling which input to TDO select MUX 372 is output from TDO select MUX 372, the select register decode circuitry 344 may alter the value in S bit register 352 based on the TDO select value in select register 366. More particularly, in an embodiment, the select register decode circuitry 344 causes a "primary value" (e.g., "1") to be placed in the S bit register 352 when the TDO select value in the select register 366 corresponds to the unique TDO select value assigned to that IC. Otherwise, the select register decode circuitry 344 causes a "secondary value" (e.g., "0") to be placed in the S bit register 352. S bit register 352 may be a single bit in width, or may be greater, in various embodiments. Returning to the above example embodiment, when select register decode circuitry 344 receives a TDO select value of "0 0" from the select register 366, the select register decode circuitry 344 may cause the primary value to be placed in the S bit register 352. Otherwise, when the select register decode circuitry 344 receives a TDO select value not assigned to the IC that includes test circuit 300 (e.g., a value of "0 1", "1 0", or "1 1"), the select register decode circuitry 344 may cause the secondary value to be placed in the S bit register 352.

According to an embodiment, the instruction decode circuitry 342 factors in the value in the S bit register 352 when decoding an instruction opcode within the IR 350. Accordingly, the value in the S bit register 352 may be referred to herein as a "decode value," and the S bit register 352 also may be referred to herein as a "decode value register." More particularly, when the value in the S bit register 352 is the primary value (e.g., "1"), the instruction decode circuitry 342 decodes instruction opcodes in the IR 350 to a first set of instructions (referred to herein as a "primary instruction set"). Conversely, when the value in the S bit register 352 is the secondary value (e.g., "0"), the instruction decode circuitry 342 decodes instruction opcodes in the IR 350 to a second set of instructions (referred to herein as a "secondary instruction set"). For example, Table 1, below, is an example of a mapping of S bit/opcode combinations to decoded instructions. It is to be understood that the specific mapping provided in Table 1 is for purposes of example and explanation only, and that a different mapping may be implemented in other systems.

TABLE 1

Example S bit/opcode combination instruction mapping

| S Bit | Opcode (IR bits 2-0) | Target Shift Register | Decoded Instruction |
|---|---|---|---|
| 0 | 0 0 0 | BYPASS | BYPASS REGISTER ENABLE |
| 0 | 0 0 1 | BYPASS | BYPASS REGISTER ENABLE |
| 0 | 0 1 0 | BYPASS | BYPASS REGISTER ENABLE |
| 0 | 0 1 1 | SELECT | SELECT REGISTER ENABLE |
| 0 | 1 0 0 | BYPASS | BYPASS REGISTER ENABLE |
| 0 | 1 0 1 | BYPASS | BYPASS REGISTER ENABLE |
| 0 | 1 1 0 | BYPASS | BYPASS REGISTER ENABLE |
| 0 | 1 1 1 | BYPASS | BYPASS REGISTER ENABLE |

TABLE 1-continued

Example S bit/opcode combination instruction mapping

| S Bit | Opcode (IR bits 2-0) | Target Shift Register | Decoded Instruction |
|---|---|---|---|
| 1 | 0 0 0 | BSR | EXTEST |
| 1 | 0 0 1 | BSR | SAMPLE/PRELOAD |
| 1 | 0 1 0 | ID CODE | ID CODE |
| 1 | 0 1 1 | SELECT | SELECT REGISTER IS ENABLED |
| 1 | 1 0 0 | TDR 1 | TDR 1 ENABLED |
| 1 | 1 0 1 | TDR 2 | TDR 2 ENABLED |
| 1 | 1 1 0 | TDR 3 | TDR 3 ENABLED |
| 1 | 1 1 1 | BYPASS | BYPASS |

In Table 1, above, the first eight rows (i.e., all rows in which the S bit has a value of "0") correspond to mappings to a secondary instruction set, and the subsequent eight rows (i.e., all rows in which the S bit has a value of "1") correspond to mappings to a primary instruction set. As indicated in Table 1, the secondary instruction set includes only "bypass register enable" instructions, with the exception of one "select register enable" instruction. When the instruction decode circuitry 342 receives values from the S bit register 352 and the IR 350 that map to the "bypass register enable" instruction, the TAP controller 340 enables the bypass register 363, and the test circuit 300 is in a bypass mode. When the instruction decode circuitry 342 receives values from the S bit register 352 and the IR 350 that map to the "select register enable" instruction (e.g., S bit value "0" and opcode "0 1 1" in Table 1), the TAP controller 340 allows a value to be clocked into the select register 366. According to an embodiment, the instruction decode circuitry in all ICs of the system map the same S bit value and opcode combination to the "select register enable" instruction. This is not necessarily true for other S bit value and opcode combinations, although it may be. In other words, the instruction decode circuitry in all ICs of the system may or may not map the same S bit values and opcode combinations to the various instructions associated with the primary instruction set.

When the primary value is stored in the S bit register 352, the instruction decode circuitry 342 maps opcodes in the IR 350 to the primary instruction set, as indicated in Table 1. In addition, MUX 370 is controlled to clock out values from one of shift registers 360-366 to the local input to TDO select MUX 372. In addition, as discussed previously, TDO select MUX 372 is controlled to clock out the value from MUX 370 to the TDO interconnect 324.

As shown in the example of Table 1, the BSR 365 is enabled, and values from the BSR 365 are clocked out from MUX 370 when the S bit/opcode combination maps to an EXTEST or SAMPLE/PRELOAD instruction. The EXTEST instruction, when executed, may be used for external testing, such as using interconnects to probe board-level behaviors. An EXTEST instruction alternatively may operate on a core (e.g., writing data to the core). The SAMPLE/PRELOAD instruction enables values to be read into the BSR 365 and loads output values before EXTEST. When the S bit/opcode combination maps to an ID CODE instruction, the ID code register 364 is enabled, and values from ID code register 364 are clocked out from MUX 370. The ID CODE instruction, when executed, selects the ID CODE register 364 so that the TAP identifier can be read out from the ID CODE register 364. When the S bit/opcode combination maps to a SELECT REGISTER IS ENABLED instruction, the select register 366 is enabled, and a new TDO select value may be clocked into the select register 366. When the S bit/opcode combination maps to either of the TDR 1 ENABLED, TDR 2 ENABLED, or TDR 3 ENABLED instructions, either the TDR 1, TDR 2, or TDR 3 register 360-362 is enabled, respectively, and values from either the TDR 1, TDR 2, or TDR 3 register 360-362 are clocked out from MUX 370. Finally, when the S bit/opcode combination maps to a BYPASS instruction, values from the bypass register 363 are clocked out from MUX 370. The BYPASS instruction, when executed, selects the bypass register 363, which places or maintains the test circuit 300 in the bypass mode.

Besides the instructions listed in Table 1, other instructions also or alternatively may be defined, including for example: INTEST (also uses the BSR 365 to prove on-chip behaviors or may operate on a core (e.g., to read data from the core)); CLAMP (drives the output interconnects using preloaded values); HIGHZ (deactivates outputs of all interconnects); RUNBIST (places the IC in a self-test mode); SCAN_N (configures a scan path select register affecting the signals to which other boundary scan operations apply); USERCODE (returns a user-defined code); other SELECT_TDR instructions (e.g., to select additional TDRs); and other manufacturer or user defined instructions.

As indicated above, multiple ICs may be coupled together in a manner that enables various signals associated with JTAG test circuitry of the ICs to be passed between the multiple ICs. For example, FIG. 4 illustrates a simplified block diagram of a system 400 (e.g., a multiple integrated circuit package or system in package (SiP)) with parallel-coupled ICs 410, 411, 412, 413, according to an example embodiment. As discussed previously, the term "parallel-coupled" refers to a configuration of connections between multiple ICs 410-413 in which the TDO interconnect (e.g., TDO interconnect 324, FIG. 3) of the most upstream IC (e.g., IC 410) is coupled with the system's TDO pin 424, and the TDO interconnects of each of the downstream ICs (e.g., ICs 411-413) are coupled to distinct input TDO interconnects (e.g., TDO interconnects 325-327, FIG. 3) of the most upstream IC (i.e., IC 410). More particularly, the multiple-IC system 400 is shown to include four ICs 410-413 (i.e., N=3 in the illustrated embodiment), each with their own JTAG-compliant test circuits. Alternate embodiments may include only two ICs and test circuits, or more than three ICs and test circuits.

Except for the TDO interconnects of ICs 410-413, which are coupled in parallel, ICs 410-413 may be considered to be connected in series (e.g., daisy chained together) so that each IC is either upstream or downstream from the other ICs. In this configuration, signals present on the TDI, TMS, TCK, and TRST_B interconnects of each upstream IC are passed through (via TDI-F, TMS-F, TCK-F, and TRST_B-F interconnects) to corresponding TDI, TMS, TCK, and TRST_B interconnects of the next downstream IC. As used herein, the term "upstream IC," as it relates to the relationship between ICs in the configurations illustrated in FIGS. 4 and 5, means an IC that is electrically closer to the external JTAG pins (e.g., pins 420-423, 520-523, FIGS. 4, 5) than the other ICs to which it is directly or indirectly connected. Similarly, the term "downstream IC" means an IC that is electrically farther from the external JTAG pins than the other ICs to which it is directly or indirectly connected. Accordingly, in FIG. 4, IC 410 is upstream of ICs 411-413, IC 411 is downstream of IC 410 and upstream of ICs 412 and 413, IC 412 is downstream of ICs 410 and 411 and upstream of IC 413, and IC 412 is downstream of ICs 410-412. In FIG. 5, which is discussed in more detail later, IC 510 is upstream of ICs 511-513, IC 511 is downstream of IC 510 and upstream of ICs 512 and 513, IC 512 is downstream of ICs 510 and 511 and upstream of IC 513, and IC 513 512 is downstream of ICs 510-512.

Referring again to FIG. 4, a TDO signal from a TAP controller of only one IC 410-413 at a time is output on the TDO pin 424. According to an embodiment, a test circuit within the most upstream IC 410 is controlled so that the signals present on the TDO pin 424 correspond to signals produced by a single TAP controller, as discussed previously in detail. More particularly, the test circuitry of the most upstream IC 410 may, for example, be configured similarly to test circuit 300, FIG. 3. As such, test circuitry of IC 410 may include a select register (e.g., select register 366, FIG. 3) and select register decode circuitry (e.g., select register decode circuitry 344, FIG. 3). Based on a value within the select register, the select register decode circuitry causes either a local TDO signal (e.g., a TDO signal produced internally within IC 410) or a TDO signal received from a downstream IC (e.g., a TDO signal produced by one of ICs 411-413) to be provided on the TDO pin 424.

Each of downstream ICs 411-413 may have simplified test circuits (e.g., they may exclude the multiple input TDO interconnects and the TDO select multiplexer (e.g., TDO interconnects 325-327 and TDO select MUX 372, FIG. 3), among other things). With a more simplified test circuit configuration, the select decode circuitry for each downstream IC 411-413 may be configured always to output their local (internally-produced) TDO signals on their respective TDO interconnects.

Alternatively, downstream ICs 411-413 may have test circuits with configurations such as that illustrated in conjunction with the IC of FIG. 3, with some more minor modifications. For example, each of the downstream ICs 411-413 may have their downstream TDO interconnects (e.g., downstream TDO interconnects 325-327, FIG. 3) tied to a pre-determined input value (e.g., 0 or 1). In addition, the select register decode circuits of each of the ICs 410-413 may decode values within the select register (e.g., select register 366, FIG. 3) differently, when determining which TDO signal should be provided on the IC's TDO interconnect (e.g., TDO interconnect 324, FIG. 3) and when determining whether or not to cause a primary value or a secondary value to be placed in the S bit register (e.g., S bit register 352, FIG. 3). For example, Table 2, below, is an example illustrating how the select register decode circuitry in different ICs may decode select register values and set S bit register values differently, in accordance with an embodiment. It is to be understood that the specific decoding provided in Table 2 is for purposes of example and explanation only, and that a different mapping may be implemented in other systems.

TABLE 2

Example of differential select register decoding
in various parallel-connected ICs

| IC | Select Register Value | S Bit | TDO MUX Input Select |
|---|---|---|---|
| 410 | 0 0 | 1 | 0 (internal) |
| 410 | 0 1 | 0 | 1 (from IC 411) |
| 410 | 1 0 | 0 | 2 (from IC 412) |
| 410 | 1 1 | 0 | 3 (from IC 413) |
| 411 | 0 0 | 0 | 1 (tied value) |
| 411 | 0 1 | 1 | 0 (internal) |
| 411 | 1 0 | 0 | 1 (tied value) |
| 411 | 1 1 | 0 | 1 (tied value) |
| 412 | 0 0 | 0 | 1 (tied value) |
| 412 | 0 1 | 0 | 1 (tied value) |
| 412 | 1 0 | 1 | 0 (internal) |
| 412 | 1 1 | 0 | 1 (tied value) |
| 413 | 0 0 | 0 | 1 (tied value) |
| 413 | 0 1 | 0 | 1 (tied value) |
| 413 | 1 0 | 0 | 1 (tied value) |
| 413 | 1 1 | 1 | 0 (internal) |

As Table 2 shows, the select register decode circuitry (e.g., select register decode circuitry 344, FIG. 3) of each IC 410-413 causes its respective S bit register (e.g., S bit register 352, FIG. 3) to have a primary value (e.g., "1") for a different select register value. More specifically, the select register decode circuitry for IC 410 causes its S bit register to have a primary value when the select register holds a value of "0 0", the select register decode circuitry for IC 411 causes its S bit register to have a primary value when the select register holds a value of "0 1", the select register decode circuitry for IC 412 causes its S bit register to have a primary value when the select register holds a value of "1 0", and the select register decode circuitry for IC 413 causes its S bit register to have a primary value when the select register holds a value of "1 1". In this manner, only one of ICs 410-413 will provide an internally generated TDO signal on its TDO interconnect (e.g., TDO interconnect 324, FIG. 3) at a time.

In addition, as mentioned above, only the most upstream IC 410 has access to all of the TDO signals from all of the ICs 410-413, in an embodiment. Accordingly, the most upstream IC 410 may include a four-input TDO select MUX (e.g., TDO select MUX 372), where input 0 may correspond to the internally-produced TDO signal, and inputs 1-3 may correspond to TDO signals received (e.g., via downstream TDO interconnects 325-327, FIG. 3) from ICs 411-413, respectively. The most upstream IC 410 determines which of those TDO signals to provide on its TDO interconnect (e.g., TDO interconnect 324, FIG. 3) based on the value in the select register. Conversely, in an embodiment, each of the downstream ICs 411-413 may include a two-input TDO select MUX, where input 0 may correspond to the internally-produced TDO signal, and input 1 may correspond to a tied value.

FIG. 5 illustrates a simplified block diagram of a system 500 (e.g., a multiple integrated circuit package or system in package (SiP)) with serial-coupled ICs 510, 511, 512, 513, according to an example embodiment. As discussed previously, the term "serial-coupled" refers to a configuration of connections between multiple ICs 510-513 in which the TDO interconnect (e.g., TDO interconnect 324, FIG. 3) of the most upstream IC (e.g., IC 510) is coupled with the system's TDO pin 524, and the TDO interconnects of each downstream IC (e.g., each of ICs 511-513) is coupled with a downstream TDO interconnect (e.g., downstream TDO interconnect 325, FIG. 3) of the next upstream IC. In addition, signals present on the TDI, TMS, TCK, and TRST_B interconnects of each upstream IC are passed through (via TDI-F, TMS-F, TCK-F, and TRST_B-F interconnects) to corresponding TDI, TMS, TCK, and TRST_B interconnects of the next downstream IC.

Again, a TDO signal from a TAP controller of only one IC 510-513 at a time is output on the TDO pin 524. The test circuitry of each IC 510-512 may, for example, be configured similarly to test circuit 300, FIG. 3, except that each IC 510-512 may include a single downstream TDO interconnect (e.g., downstream TDO interconnect 325, FIG. 3) and a two-input TDO select MUX (e.g., TDO select MUX 372, FIG. 3). The most downstream IC 513 may have an even simpler test circuit, in that it may function without any downstream TDO interconnect (e.g., since it does not receive any downstream TDO signal) and it may exclude a TDO select MUX (e.g., since it may simply output its internally-generated TDO signal or no signal.

According to an embodiment, a test circuit within each upstream IC 510-512 may select either its internally-generated TDO signal to produce on its TDO interconnect (e.g., TDO interconnect 324, FIG. 3) or a TDO signal received from the next downstream IC (e.g., on downstream TDO interconnect 325, FIG. 3). In this manner, a TDO signal from any downstream IC 511-513 may be propagated up to the most upstream IC 510, and the test circuit within the most upstream IC 510 is controlled so that the signals present on the TDO pin 524 correspond either to its internally-produced TDO signal or to a TDO signal received (e.g., via downstream TDO interconnect 325, FIG. 3) from the next downstream IC 511. More specifically, the test circuitry of ICs 510-513 each may include a select register (e.g., select register 366, FIG. 3) and select register decode circuitry (e.g., select register decode circuitry 344, FIG. 3). Based on a value within the select register, the select register decode circuitry of each upstream IC 510-512 causes either the local TDO signal (e.g., a TDO signal produced internally within an upstream IC 510-512) or a TDO signal received from a downstream IC (e.g., a TDO signal produced by the next downstream IC 511, 512, or 513) to be provided on its TDO interconnect.

The select register decode circuits of each of the ICs 510-513 may decode values within the select register (e.g., select register 366, FIG. 3) differently, when determining which TDO signal should be provided on the IC's TDO interconnect (e.g., TDO interconnect 324, FIG. 3) and when determining whether or not to cause a primary value or a secondary value to be placed in the S bit register (e.g., S bit register 352, FIG. 3). For example, Table 3, below, is an example illustrating how the select register decode circuitry in different ICs may decode select register values and set S bit register values differently, in accordance with an embodiment. It is to be understood that the specific decoding provided in Table 3 is for purposes of example and explanation only, and that a different mapping may be implemented in other systems.

TABLE 3

Example of differential select register decoding in various serial-connected ICs

| IC | Select Register Value | S Bit | TDO MUX Input Select |
|---|---|---|---|
| 510 | 0 0 | 1 | 0 (internal) |
| 510 | 0 1 | 0 | 1 (from IC 511) |
| 510 | 1 0 | 0 | 1 (from IC 511) |
| 510 | 1 1 | 0 | 1 (from IC 511) |
| 511 | 0 0 | 0 | 1 (from IC 512) |
| 511 | 0 1 | 1 | 0 (internal) |
| 511 | 1 0 | 0 | 1 (from IC 512) |
| 511 | 1 1 | 0 | 1 (from IC 512) |
| 512 | 0 0 | 0 | 1 (from IC 513) |
| 512 | 0 1 | 0 | 1 (from IC 513) |
| 512 | 1 0 | 1 | 0 (internal) |
| 512 | 1 1 | 0 | 1 (from IC 513) |
| 513 | 0 0 | 0 | 1 (tied value) |
| 513 | 0 1 | 0 | 1 (tied value) |
| 513 | 1 0 | 0 | 1 (tied value) |
| 513 | 1 1 | 1 | 0 (internal) |

As Table 3 shows, the select register decode circuitry (e.g., select register decode circuitry 344, FIG. 3) of each IC 510-513 causes its respective S bit register (e.g., S bit register 352, FIG. 3) to have a primary value (e.g., "1") for a different select register value. More specifically, the select register decode circuitry for IC 510 causes its S bit register to have a primary value when the select register holds a value of "0 0", the select register decode circuitry for IC 511 causes its S bit register to have a primary value when the select register holds a value of "0 1", the select register decode circuitry for IC 512 causes its S bit register to have a primary value when the select register holds a value of "1 0", and the select register decode circuitry for IC 513 causes its S bit register to have a primary value when the select register holds a value of "1 1". In this manner, only one of ICs 510-513 will provide an internally generated TDO signal on its TDO interconnect (e.g., TDO interconnect 324, FIG. 3) at a time.

Figure 6:
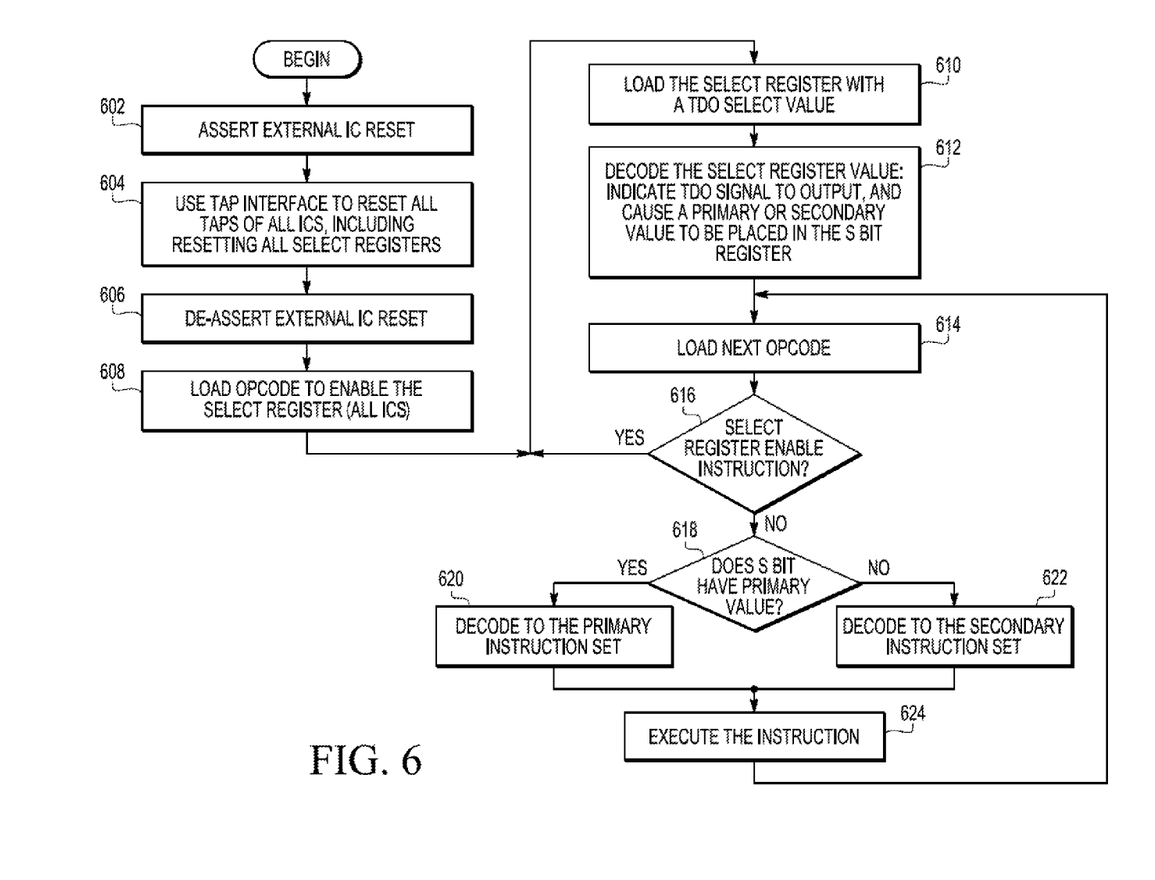
FIG. 6 illustrates a flowchart of a method for testing a multiple-IC system, according to an example embodiment.

FIG. 6 illustrates a flowchart of a method for testing a multiple-IC system (e.g., system 400 or 500, FIGS. 4, 5), according to an example embodiment. The method may be used to test a multiple-IC system having any number of ICs interconnected in a series as described above. To facilitate the discussion of the method, various elements of the test circuit 300 of FIG. 3 may be referred to. However, it is to be understood that the method may be used in a system that includes different embodiments of a test circuit, such as alternate embodiments previously discussed.

The method may begin by resetting the TAP controllers (e.g., TAP controller 340, FIG. 3) of all of the ICs in the system. When the system includes a TRST_B interconnect and each test circuit includes a corresponding interconnect (e.g., TRST_B interconnect 323, FIG. 3), the TAP controllers may be asynchronously reset to a reset state (e.g., the Test-Logic-Reset controller state defined in IEEE Standard 1149.1) when a logic 0 is applied to a TRST_B pin (e.g., TRST_B pin 423, FIG. 4). Otherwise, when reset is not performed using a signal on a TRST_B pin, the reset process may include clocking the system's external test clock (e.g., the clock signal on TCK pin 422 or 522, FIGS. 4, 5) five times with the system's external TMS signal (e.g., the signal on TMS pin 421 or 521, FIGS. 4, 5) driven with a logic high state, to ensure that each TAP controller, which may be in an arbitrary state at this point, is transitioned to the reset state. In such an embodiment, reset may include blocks 602-606, described below. More particularly, the reset process may begin, for example, by asserting an external IC reset signal that is provided to at least the most upstream IC in the series (e.g., IC 410, FIG. 4), in block 602. For example, this may include external test equipment providing a signal to a reset interconnect (e.g., a RESET_B interconnect, not shown) of the most upstream IC in the series.

In order to reset the TAP controllers of each IC, appropriate signals are provided (e.g., by external test equipment) to the external TAP interface, in block 604. In other words, the TAP interface (TRST_B or clocking TCK with TMS driven to a logic high state) is used to reset (per IEEE Standard 1149.1) the TAP controllers of all ICs in the series.

At this point, the select register (e.g., select register 344, FIG. 3) of each IC is loaded with a value that indicates which of the ICs will produce the TDO signal on the external TDO pin (e.g., pin 424, FIG. 4). To accomplish this, in block 608, an opcode is loaded into the instruction register (e.g., IR 350, FIG. 3) that causes all of the select registers to be enabled. In the example provided above in conjunction with Table 1, for example, an opcode having the value "0 1 1" may be loaded into the instruction registers of all of the ICs simultaneously. The instruction decode circuitry (e.g., instruction decode circuitry 342, FIG. 3) of each IC decodes the opcode to a SELECT REGISTER ENABLE instruction, according to the example, and the TAP controller enables the select register accordingly. In block 610, a value may then be loaded into each select register.

Blocks 612-622 are then performed separately by the test circuits of each IC. In block 612, select register decode circuitry (e.g., select register decode circuitry 344, FIG. 3) decodes the value in the select register. Based on the decoding operation, the select register decode circuitry may provide a TDO select signal (e.g., TDO select signal 346, FIG. 3) to a TDO select MUX (e.g., TDO select MUX 372, FIG. 3), indicating whether an internally-generated TDO signal or an externally provided TDO signal (e.g., from a downstream IC) should be output to the TDO interconnect (e.g., TDO interconnect 324, FIG. 3). In addition, based on the decoding operation, the select register decode circuitry may cause a primary or a secondary value (e.g., a "1" or a "0") to be placed in the S bit register (e.g., S bit register 352, FIG. 3). As discussed in detail previously, the value in the S bit register affects how the instruction decode circuitry (e.g., instruction decode circuitry 342, FIG. 3) subsequently decodes an opcode loaded into the instruction register (e.g., IR 350, FIG. 3).

For example, in block 614, a next opcode may be loaded into the instruction register. The opcode may correspond, for example, to any of the opcodes listed in Table 1 or to other opcodes. When the opcode again corresponds to a SELECT REGISTER ENABLE instruction, as indicated by decision block 616, another select value may be loaded into the select register in block 610 and the method iterates as shown. When the opcode does not correspond to a SELECT REGISTER ENABLE instruction, the instruction decode circuitry (e.g., instruction decode circuitry 342, FIG. 3) factors the S bit value in while decoding the instruction. For example, when a determination is made in block 618 that the S bit register has a primary value stored therein, the instruction decode circuitry decodes the S bit/opcode combination to correspond to an instruction within a primary instruction set, in block 620 (e.g., an instruction in which the S bit equals one, in Table 1). Conversely, when a determination is made in block 618 that the S bit register has a secondary value stored therein, the instruction decode circuitry decodes the S bit/opcode combination to correspond to an instruction within a secondary instruction set, in block 622 (e.g., an instruction in which the S bit equals zero, in Table 1). Either way, the instruction is then executed by the TAP controller (e.g., TAP controller 340, FIG. 4), and the method iterates as shown.

Thus, various embodiments of integrated circuit testing methods and apparatus have been described above. An embodiment of an integrated circuit includes a first input interconnect, a second input interconnect, an output interconnect, a shift register, a select register, a TAP controller, and select register decode circuitry. The TAP controller is coupled to the first input interconnect and the select register, and the TAP controller is configured to shift a select value provided on the first input interconnect into the select register. The select register decode circuitry is configured to control, based on the select value, which of a plurality of test data output signals is provided to the output interconnect. The plurality of test data output signals includes at least a first test data output signal and a second test data output signal. The first test data output signal is provided by the shift register, and the second test data output signal is received from a second integrated circuit on the second input interconnect.

An embodiment of a multiple integrated circuit package includes a plurality of external pins, including a TDO pin, a first integrated circuit, and a second integrated circuit. The first integrated circuit includes a first input interconnect, a second input interconnect, a first output interconnect coupled to the TDO pin, a first shift register, a first select register, a first TAP controller, and first select register decode circuitry. The first TAP controller is coupled to the first input interconnect and to the first select register, and the first TAP controller is configured to shift a select value provided on the first input interconnect into the first select register. The first select register decode circuitry is configured to control, based on the select value, which of a first plurality of test data output signals is provided to the output interconnect. The first plurality of test data output signals includes at least a first test data output signal and a second test data output signal. The first test data output signal is provided by the first shift register, and the second test data output signal is received from a second integrated circuit on the second input interconnect.

An embodiment of a method for testing a multiple integrated circuit package that includes at least a first integrated circuit and a second integrated circuit is performed by the first integrated circuit. The method includes the steps of loading a select value from a first input interconnect of the first integrated circuit into a select register of the first integrated circuit, receiving a first test data output signal from the second integrated circuit on a second input interconnect of the first integrated circuit, and providing one of a plurality of test data output signals to an output interconnect of the first integrated circuit based on the select value in the select register. The plurality of test data output signals includes the first test data output signal from the second integrated circuit and a locally-produced test data output signal.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments described herein are, for example, capable of operation or fabrication in sequences or arrangements other than those illustrated or otherwise described herein. In addition, the sequence of processes, blocks or steps depicted in and described in conjunction with any flowchart is for example purposes only, and it is to be understood that various processes, blocks or steps may be performed in other sequences and/or in parallel, in other embodiments, and/or that certain ones of the processes, blocks or steps may be combined, deleted or broken into multiple processes, blocks or steps, and/or that additional or different processes, blocks or steps may be performed in conjunction with the embodiments. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An integrated circuit comprising:
   a first input interconnect;
   a second input interconnect;
   an output interconnect;
   a shift register selected from a boundary scan register and a test data register;
   a bypass register;
   a select register;
   an instruction register;
   a test access port (TAP) controller coupled to the first input interconnect, the instruction register, and the select register, wherein the TAP controller is configured to shift a select value provided on the first input interconnect into the select register, and the TAP controller is configured to shift an opcode provided on the first input interconnect into the instruction register, and wherein the select value may be a first select value assigned to the integrated circuit or the select value may be a different second select value assigned to a second integrated circuit that is coupled to the second input interconnect;
   select register decode circuitry configured to control, based on the select value, which of a plurality of test data output signals is provided to the output interconnect, wherein the plurality of test data output signals includes at least a first test data output signal and a second test data output signal, and wherein the first test data output signal is provided by the shift register, and the second test data output signal is received from the second integrated circuit through the second input interconnect; and
   instruction decode circuitry, wherein the instruction decode circuitry is configured to map the opcode to an instruction to be executed by the TAP controller, wherein the instruction decode circuitry maps the opcode to a first instruction when the select value is the first select value, and the instruction decode circuitry maps the opcode to a second instruction when the select value is the second select value, wherein the first instruction, when executed, causes a value in the shift register to be clocked out on the output interconnect, and the second instruction, when executed, causes a value in the bypass register to be clocked out on the output interconnect.

2. The integrated circuit of claim 1, wherein the select register decode circuitry is configured to cause the first test data output signal to be provided to the output interconnect when the select value is the first select value assigned to the integrated circuit.

3. The integrated circuit of claim 1, further comprising:
   a multiplexer having an output coupled to the output interconnect and a plurality of inputs, including at least a first input coupled to receive the first test data output signal and a second input coupled to receive the second test data output signal, and
   wherein the select register decode circuitry controls which signal present on the plurality of inputs is provided to the output interconnect by providing an input select signal to the multiplexer.

4. The integrated circuit of claim 3, further comprising:
   a third input interconnect,
   wherein the plurality of inputs of the multiplexer includes at least a third input coupled to receive a third test data output signal from a third integrated circuit on the third input interconnect.

5. The integrated circuit of claim 1, further comprising:
   a decode value register coupled to the TAP controller and configured to store a decode value derived from the select value, wherein the instruction decode circuitry is configured to map a combination of the opcode and the decode value to the instruction to be executed by the TAP controller.

6. An integrated circuit comprising:
   a first input interconnect;
   a second input interconnect;
   an output interconnect;
   a shift register;
   a select register;
   a test access port (TAP) controller coupled to the first input interconnect and the select register, wherein the TAP controller is configured to shift a select value provided on the first input interconnect into the select register;
   select register decode circuitry configured to control, based on the select value, which of a plurality of test data output signals is provided to the output interconnect, wherein the plurality of test data output signals includes at least a first test data output signal and a second test data output signal, and wherein the first test data output signal is provided by the shift register, and the second test data output signal is received from a second integrated circuit on the second input interconnect;
   an instruction register coupled to the TAP controller;
   a decode value register coupled to the TAP controller and configured to store a decode value; and
   instruction decode circuitry, and
   wherein the TAP controller is further configured to shift an opcode provided on the first input interconnect into the instruction register, and the instruction decode circuitry is configured to map a combination of the decode value and the opcode to an instruction to be executed by the TAP controller, and
   wherein the select register decode circuitry is further configured to cause the decode value to be stored in the register based on the select value.

7. The integrated circuit of claim 6, wherein the decode value may be a first value or a second value, and wherein the instruction decode circuitry is configured to map the combination of the decode value and the opcode to an instruction of a primary instruction set when the decode value is the first value, and to map the combination of the decode value and the opcode to an instruction of a secondary instruction set when the decode value is the second value.

8. A multiple integrated circuit package comprising:
   a plurality of external package pins, including a test data out (TDO) pin;
   a first integrated circuit; and
   a second integrated circuit,
   wherein the first integrated circuit includes
      a first input interconnect,
      a second input interconnect,
      a first output interconnect coupled to the TDO pin,
      a first shift register selected from a boundary scan register and a test data register,
      a first bypass register,
      a first select register, a first instruction register, a first test access port (TAP) controller coupled to the first input interconnect and to the first select register and the first instruction register, wherein the first TAP controller is configured to shift a select value provided on the first input interconnect into the first select register, and the first TAP controller is configured to shift an opcode provided on the first input interconnect into the first instruction register, and wherein the select value may be a first select value assigned to the first integrated circuit or the select value may be a different second select value assigned to a second integrated circuit that is coupled to the second input interconnect, first select register decode circuitry configured to control, based on the select value, which of a first plurality of test data output signals is provided to the output interconnect, wherein the first plurality of test data output signals includes at least a first test data output signal and a second test data output signal, and wherein the first test data output signal is provided by the first shift register, and the second test data output signal is received from the second integrated circuit through the second input interconnect, and instruction decode circuitry, wherein the instruction decode circuitry is configured to map the opcode to an instruction to be executed by the TAP controller, wherein the instruction decode circuitry maps the opcode to a first instruction when the select value is the first select value, and the instruction decode circuitry maps the opcode to a second instruction when the select value is the second select value, wherein the first instruction, when executed, causes a value in the first shift register to be clocked out on the first output interconnect, and the second instruction, when executed, causes a value in the first bypass register to be clocked out on the first output interconnect.

9. The multiple integrated circuit package of claim 8, wherein the first integrated circuit further includes:

a multiplexer having an output coupled to the first output interconnect and a plurality of inputs, including at least a first input coupled to receive the first test data output signal and a second input coupled to the second input interconnect to receive the second test data output signal, and wherein the first select register decode circuitry controls which signal present on the plurality of inputs is provided to the first output interconnect by providing an input select signal to the multiplexer.

10. The multiple integrated circuit package of claim 8, wherein the second integrated circuit comprises:

a second shift register configured to produce the second test data output signal; and a second output interconnect coupled to the second input interconnect of the first integrated circuit.

11. The multiple integrated circuit package of claim 10, wherein:

the first integrated circuit also includes a third input interconnect, and the multiple integrated circuit package further comprises a third integrated circuit that includes a third shift register configured to produce a third test data output signal; and a third output interconnect coupled to the third input interconnect of the first integrated circuit to enable the third integrated circuit to provide the third test data output signal to the first integrated circuit as another of the plurality of test data output signals.

12. The multiple integrated circuit package of claim 11, wherein the first integrated circuit further includes:

a multiplexer having an output coupled to the first output interconnect and a plurality of inputs, including at least a first input coupled to receive the first test data output signal, a second input coupled to the second input interconnect to receive the second test data output signal, and a third input coupled to the third input interconnect to receive the third test data output signal, and wherein the first select register decode circuitry controls which signal present on the plurality of inputs is provided to the first output interconnect by providing an input select signal to the multiplexer.

13. A multiple integrated circuit package comprising:

a plurality of external package pins, including a test data out (TDO) pin;

a first integrated circuit that includes a first input interconnect, a second input interconnect, a first output interconnect coupled to the TDO pin, a first shift register, a first select register, a first test access port (TAP) controller coupled to the first input interconnect and to the first select register, wherein the first TAP controller is configured to shift a select value provided on the first input interconnect into the first select register, and first select register decode circuitry configured to control, based on the select value, which of a first plurality of test data output signals is provided to the output interconnect, wherein the first plurality of test data output signals includes at least a first test data output signal and a second test data output signal, and wherein the first test data output signal is provided by the first shift register, and the second test data output signal is received from a second integrated circuit on the second input interconnect; and a second integrated circuit that includes a second shift register, a second output interconnect coupled to the second input interconnect of the first integrated circuit, a third input interconnect, a fourth input interconnect, a second select register, a second TAP controller coupled to the third input interconnect and to the second select register, wherein the second TAP controller is configured to shift the select value provided on the third input interconnect into the second select register, and second select register decode circuitry configured to control, based on the select value, which of a second plurality of test data output signals is provided to the second output interconnect as the second test data, wherein the second plurality of test data output signals includes at least a third test data output signal and a fourth test data output signal, and wherein the third test data output signal is provided by the second shift register, and the fourth test data output signal is received on the fourth input interconnect, and wherein the multiple integrated circuit package further comprises:

a third integrated circuit that includes a third shift register configured to produce the third test data output signal, and a third output interconnect coupled to the fourth input interconnect of the second integrated circuit to enable the third integrated circuit to provide the third test data output signal to the second integrated circuit.

14. A method for testing a multiple integrated circuit package that includes at least a first integrated circuit and a second integrated circuit, the method performed by the first integrated circuit and comprising the steps of:

loading a select value from a first input interconnect of the first integrated circuit into a select register of the first integrated circuit, wherein the select value may be a first select value assigned to the first integrated circuit or the select value may be a different second select value assigned to the second integrated circuit;

receiving a first test data output signal from the second integrated circuit on a second input interconnect of the first integrated circuit;

providing one of a plurality of test data output signals to an output interconnect of the first integrated circuit based on the select value in the select register, wherein the plurality of test data output signals includes the first test data output signal from the second integrated circuit and a locally-produced test data output signal;

loading an opcode into an instruction register of the integrated circuit; and mapping the opcode to an instruction to be executed by a test controller of the first integrated circuit, wherein the opcode is mapped to a first instruction when the select value is the first select value, and the opcode is mapped to a second instruction when the select value is the second select value, wherein the first instruction, when executed, causes a value in a shift register selected from a boundary scan register and a test data register to be clocked out on the output interconnect, and the second instruction, when executed, causes a value in a bypass register to be clocked out on the output interconnect.

15. The method of claim 14, wherein the multiple integrated circuit package also includes a third integrated circuit, the method further comprising:

receiving a second test data output signal from the third integrated circuit on a third input interconnect of the first integrated circuit, wherein the second test data output signal is included in the plurality of test data output signals, one of which is provided to the output interconnect based on the select value in the select register.

16. The method of claim 14, wherein the step of providing comprises providing the locally-produced test data output signal to the output interconnect when the select value corresponds to the first select value assigned to the first integrated circuit.

17. The method of claim 14, wherein the providing step comprises:

controlling which of the plurality of test data output signals is provided to the output interconnect by providing an input select signal to a multiplexer of the first integrated circuit.

18. The method of claim 14, further comprising:

storing a decode value in a decode value register of the first integrated circuit, wherein the decode value is derived from the select value, and the step of mapping includes mapping a combination of the opcode and the decode value to the instruction to be executed by the test controller.

19. The method of claim 18, wherein the decode value may be a first value or a second value, and wherein mapping the combination of the decode value and the opcode to an instruction comprises mapping the combination to an instruction of a primary instruction set when the decode value is the first value, and mapping the combination to an instruction of a second instruction set when the decode value is the second value.

* * * * *